(12) United States Patent
Collins

(10) Patent No.: US 6,970,110 B1
(45) Date of Patent: Nov. 29, 2005

(54) PROBABILITY CENTRIFUGE ALGORITHM WITH MINIMUM LATERALLY ADIABATICALLY-REDUCED FISHER INFORMATION CALCULATION

(76) Inventor: Dennis G. Collins, Urb. Mayaguez Terrace, 6009 Calle R. Martinez Torres, Mayaguez, PR (US) 00682-6630

( * ) Notice: Subject to any disclaimer, the term of this patent is extended or adjusted under 35 U.S.C. 154(b) by 94 days.

(21) Appl. No.: 11/057,849

(22) Filed: Feb. 15, 2005

Related U.S. Application Data

(60) Provisional application No. 60/642,257, filed on Jan. 8, 2005.

(51) Int. Cl.[7] .......................... H03M 5/16; H04N 7/24; H04N 7/12
(52) U.S. Cl. ............................ 341/57; 341/67; 341/87; 348/443; 348/445; 375/240.03; 375/240.06
(58) Field of Search .............................. 341/57, 67, 87, 341/76; 375/240.16, 240.24; 348/443, 445, 348/400

(56) References Cited

U.S. PATENT DOCUMENTS

| | | | | |
|---|---|---|---|---|
| 4,068,298 A | * | 1/1978 | Dechant et al. ................ | 341/76 |
| 4,422,165 A | | 12/1983 | Thomas et al. | |
| 4,464,650 A | | 8/1984 | Eastman et al. | |
| 4,558,302 A | | 12/1985 | Welch | |
| 4,814,746 A | | 3/1989 | Miller et al. | |
| 4,827,338 A | * | 5/1989 | Gerard .................. | 375/240.18 |
| 5,099,121 A | | 3/1992 | Allen | |
| 5,818,530 A | * | 10/1998 | Canfield et al. .......... | 348/400.1 |
| 6,054,943 A | * | 4/2000 | Lawrence ..................... | 341/87 |
| 6,245,511 B1 | | 6/2001 | Gulati | |
| 6,260,033 B1 | | 7/2001 | Tatsuoka | |
| 6,288,675 B1 | | 9/2001 | Maloney | |
| 6,301,571 B1 | | 10/2001 | Tatsuoka | |
| 6,363,113 B1 | * | 3/2002 | Faryar et al. .......... | 375/240.03 |
| 6,433,710 B1 | | 8/2002 | Heavens et al. | |
| 6,466,894 B2 | | 10/2002 | Takeuchi | |
| 6,704,662 B2 | | 3/2004 | Gulati | |
| 6,766,280 B2 | | 7/2004 | Takeuchi | |
| 6,785,240 B1 | | 8/2004 | Cao et al. | |
| 2002/0152037 A1 | | 10/2002 | Sunshine et al. | |
| 2003/0055600 A1 | | 3/2003 | Takeuchi | |
| 2003/0229445 A1 | | 12/2003 | Tingley | |
| 2004/0072232 A1 | | 4/2004 | Gulati | |
| 2004/0084624 A1 | | 5/2004 | Ming et al. | |
| 2004/0086174 A1 | | 5/2004 | Sun | |
| 2004/0213415 A1 | | 10/2004 | Rama et al. | |

OTHER PUBLICATIONS

Battino et al., Thermodynamics, Academic Press, 1968, p. 263, no date.

Li et al., "Accurate Estimation of the Fisher Information Matrix for the PET Image Reconstruction Problem", IEEE Transac. on Med. Imaging, V. 23, No. 9, Sep. 2004, pp. 1057-1064.

(Continued)

*Primary Examiner*—Lam T. Mai
(74) *Attorney, Agent, or Firm*—Lydia M. De Jesús

(57) ABSTRACT

A data compression algorithm which computes from a given probability density, in continuous or histogram form, a "probability centrifuge" probability density and also the Fisher information of the density. The density preserves Shannon entropy of the original density and the Fisher information represents the minimum Fisher information obtainable by "lateral" adiabatic reduction. The data compression algorithm can alternately be used to perform a "vertically" adiabatic reduction, a "radial" adiabatic reduction, or a "sectoral" adiabatic reduction. Said algorithm may provide alternate information for applications such as image reconstruction and protein folding analysis.

9 Claims, 3 Drawing Sheets

OTHER PUBLICATIONS

Migliavacca et al., "Analysis and Optimization of Gas-Centrifugal Separation of Uranium Isotopes by Neural Networks", Braz. Journal of Chem. Eng., V.19, No. 3, Sep. 2002, pp. 29-306.

Gunawan et al., "Sensitivity Analysis of Discrete Stochatics Systems", "http://cs.ucsb.edu/%7Eycao/publication/Gunawan%20biophysJ%202004.pdf", no date.

Gustavsson, K., "Mathematical and Numerical Modeling of 1-D and 2-D Consolidation", Ph. D. Dissertation, Kungl Techniska Hogskolan, Stockholm, Sweden, Apr. 2003.

Schultz, S., "Math Helps Explain Protein Folding", Princeton Weekly Bulletin, V. 89, No. 3, Sep. 1999.

Cover et al., Elements of Information Theory, John Wiley and Sons, 1991, pp. 235-236, no date.

Seung et al., "Simple Models for Reading Neuronal Population Codes", Proc. Natl. Acad. Sci. USA, V. 90, Nov. 1993, pp. 10749-10753.

* cited by examiner

PROBABILITY CENTRIFUGE ALGORITHM WITH MINIMUM LATERALLY ADIABATICALLY-REDUCED FISHER INFORMATION CALCULATION

The present application claims the benefit of Provisional application Ser. No. 60/642,257, filed on Jan. 8, 2005.

BACKGROUND OF THE INVENTION

1. Field of the Invention

The invention relates to data compression in testing systems performing measurements involving a probability density function. In particular, it relates to an algorithm for supplying information in a similar manner to the mechanical effect of a centrifuge.

2. Description of Related Art

Several U.S. Patents treat the application of Fisher information to measure a set of parameters. See for example U.S. Pat. No. 6,433,710 B1 of Heavens, which applies the use of a Fisher matrix for determining a set of parameters $\{\Theta a\}$. However, none of them appear to deal with "morphing" a probability density as in the present invention, or calculating the Fisher information of the new density. Generally lateral reduction discussed in this invention is not appropriate to the prior disclosures since there is no probability density related to these parameters, although in some cases this property may be arranged by weighting of different densities.

Earlier methods for dealing with data compression can be found in U.S. Pat. No. 4,464,650 by Lempel et al., U.S. Pat. No. 4,814,746 by Miller et al., and U.S. Pat. No. 4,588,302 by Welch.

There are also excellent papers (Migliavacca et al. 2002, Gunawan et al. 2004 and Gustavsson 2003) that develop mathematical models of centrifuge, consolidation, or sedimentation process. However, it is not apparent how such models would apply to the general case of a possibly-abstract probability density.

BRIEF SUMMARY OF THE INVENTION

The algorithm of this invention applies a type of data compression to a probability density, similar to the mechanical effect of a centrifuge. Namely, it pushes probability to the positive side of a "wall" at x=0, without affecting probability amplitudes, as shown by FIGS. 1A and 1B. This procedure eliminates "kinks" in the density, thereby reducing Fisher information versus the x parameter, so that the resulting calculated Fisher information is minimum for such lateral or horizontal movement of probability. The algorithm incorporates the discovery that such operations preserve Shannon entropy, although there are other adiabatic or entropy-preserving operations, such as "vertical" operations, similar to insulated expansion/contraction of a gas, which also may be considered to preserve Shannon entropy, and reduce Fisher information even more. See FIGS. 3A and 3B.

Whereas previous data compression algorithms try to maximize Fisher information, so as to be lossless (so that information can be recovered), the algorithm of the present invention tries to minimize Fisher information, so as to determine the maximum Fisher information that can be lost without affecting entropy. Taking Fisher information as a proxy for energy, the algorithm tries to maintain the thermodynamic optimization principle that energy tends to a minimum among states with constant entropy and volume (Cf. Battino 1968, p 263. Here probability conservation corresponds to constant volume.) The Fisher information lost may represent "emergy" or energy memory, and reflect quality of energy. The effect of the algorithm, illustrated for example by FIGS. 1A and 1B, may represent a big smooth fish eating several small fish or a large company like General Motors incorporating several small companies.

BRIEF DESCRIPTION OF THE DRAWINGS

The present invention is described in detail below with reference to the drawings in which.

DETAILED DESCRIPTION OF THE PREFERRED EMBODIMENTS

Figure 2A:
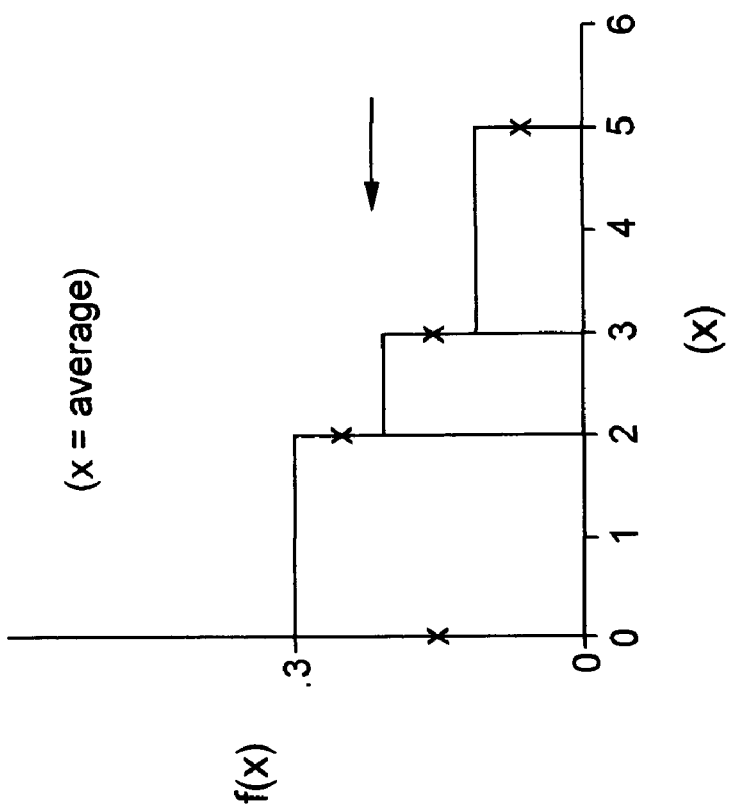
FIG. 2A shows a discrete laterally adiabatically-reduced probability density function.
Figure 2B:
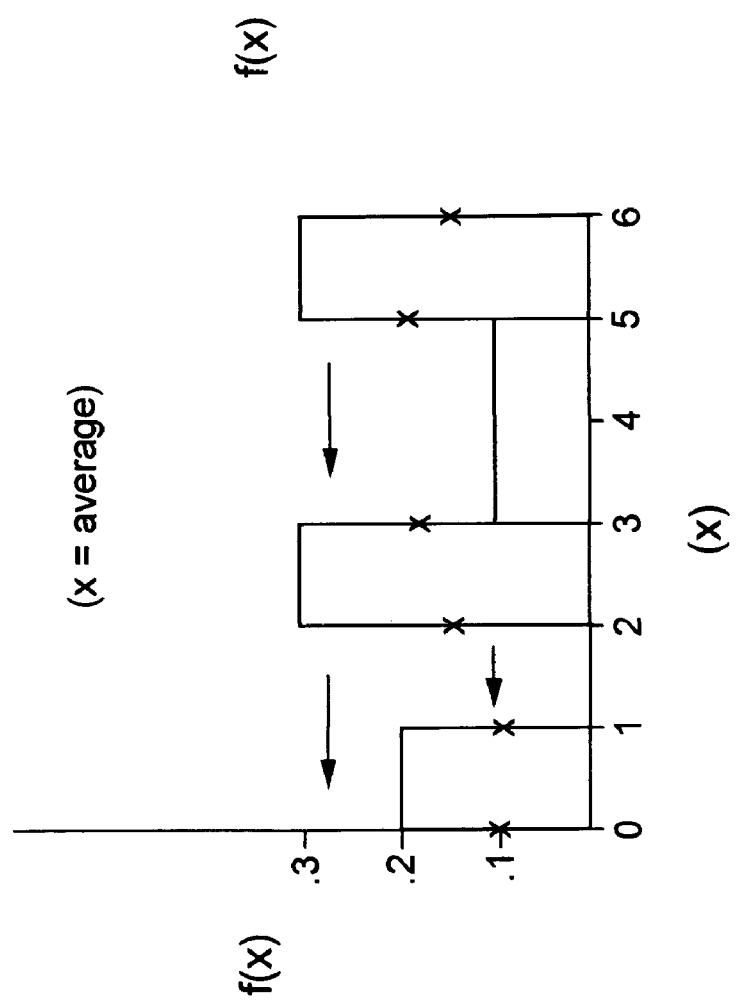
FIG. 2B shows the effect of the algorithm of the present invention in data compression of the discrete laterally adiabatically-reduced probability density function of FIG. 2A.
Figure 3B:
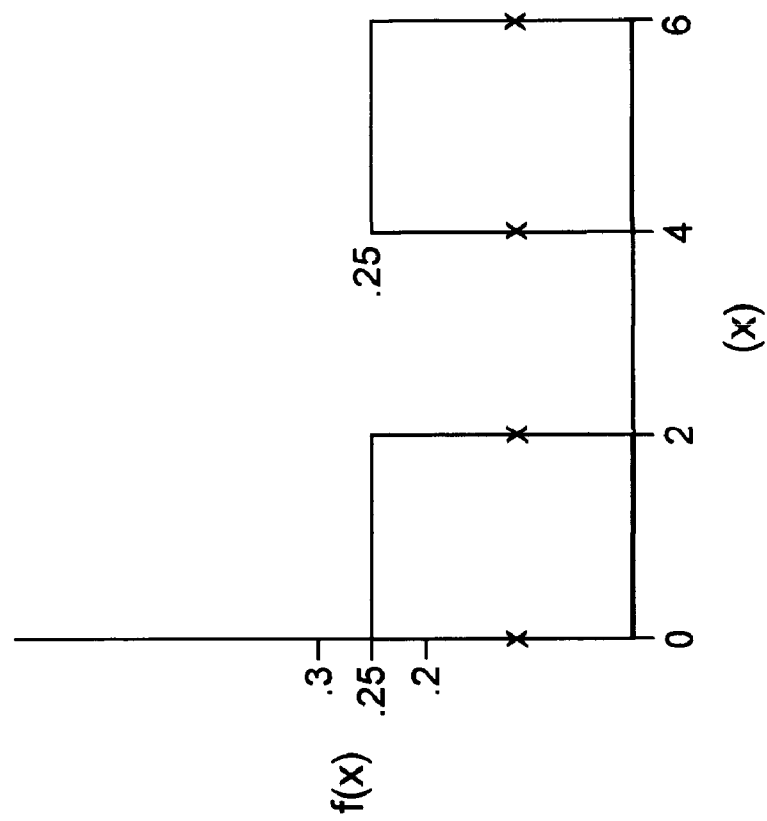
FIG. 3B shows the effect of the algorithm of the present invention in data compression of the discrete vertically adiabatically-reduced probability density function of FIG. 3A.
Figure 3A:
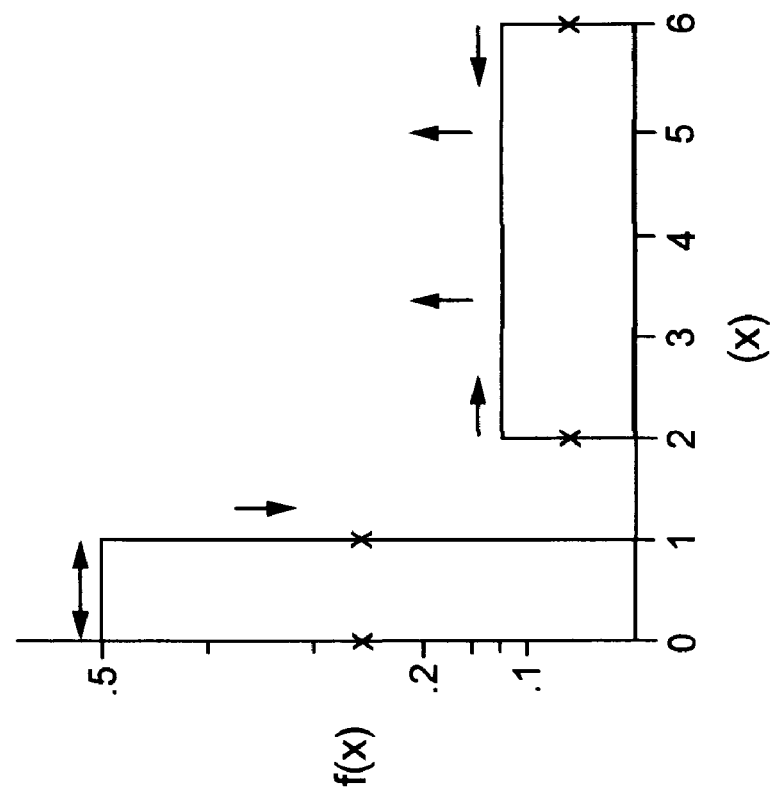
FIG. 3A shows a discrete vertically adiabatically-reduced probability density function.

The algorithm of the present invention applies a formula midway in the calculation of Lebesgue integral, namely:

$$\int f(x)dx \approx \Sigma^i y_i m[\{x : y_i \leq f(x) \leq y_{i+1}\}] \quad \text{(eqn. 1),}$$

where m is the measure along the x-axis of the set described. Only instead of finishing the integral approximation by taking the sum, the algorithm collects the measure along the positive x-axis as y decreases from its maximum value. The resulting profile can be smoothed (i.e. smoothly interpolated), by many methods familiar in numerical analysis, so as to be able to calculate the Fisher information:

$$\int (f')^2 / f \, dx \quad \text{(eqn. 2),}$$

or the discrete approximation:

$$\Theta^i (\Delta y_i)^2 / \text{average } y_i \quad \text{(eqn. 3),}$$

for histogram data can be obtained directly. Here $\Delta y_i$ represents the jump going from one histogram block to another and average $y_i$ represents the average of the two y-values of histogram blocks adjacent to the jump. This aspect of the invention is illustrated by FIGS. 2A and 2B. Similarly, FIGS. 3A and 3B illustrate the algorithm of the present invention adapted for vertical data compression of a discrete vertically adiabatically-reduced probability density function.

The algorithm of the present invention, shown below written in Mathematica™ programming language, calculates the measure m through the "Min" command and the probability density profile through the "Interpolation" command. The example included, shown in FIG. 1A, has the original probability density:

$f(x) = 1 + 0.5 * \text{Sin} [2\Pi * 6x]$ for $0 \leq x \leq 1$ and $f(x) = 0$ otherwise.

Figure 1B:
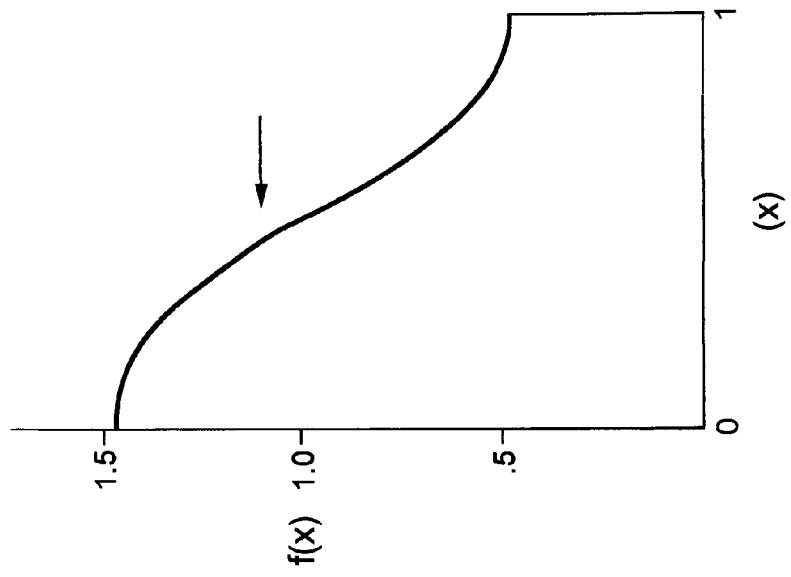
FIG. 1B shows the centrifuge effect of the algorithm of the present invention in data compression of the continuous laterally adiabatically-reduced probability density function of FIG. 1A.
Figure 1A:
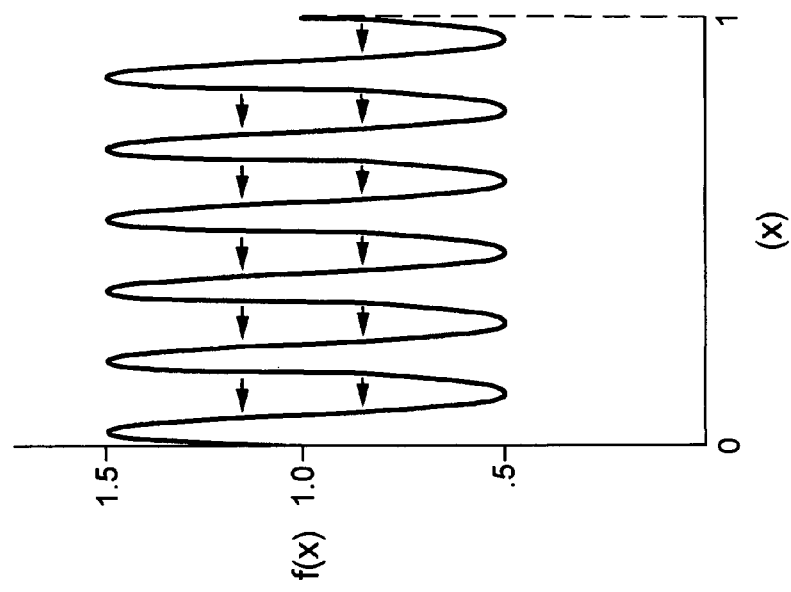
FIG. 1A shows a continuous laterally adiabatically-reduced probability density function.

It is known that the "centrifuge" density should be f(x) =1+0.5*Cos [Πx] for 0≦x≦1 and =0 otherwise, as shown in FIG. 1B, so that the error can be calculated for this case.

The following is an example of algorithm of the present invention written in Mathematica™ programming language:

```
In[28]:=SimpsonRule[expr_,x_,a_,b_,n_]:=
    Module[{h,fa,fb,i}],h=N[(b-a)/(2*n)];fa=N[expr/.x->a];
        fb=N[expr/.x->b];h*((fa+fb)+2*Sum[expr/.x->
(a+2*i*h),{i,1,n-1}]+4*Sum[expr/.x->(a+(2*i-1) *h),
{i,1,n}]/3
xmin=0;xmax=1.0;ymin=.5;ymax=1.5;m=40;h=N[(ymax-ymin)/m ;
p[x_]=1+.5*Sin[2*Pi*6*x];
T=Table[{x[k]= (SimpsonRule[Min[ymin+k*h,p[x]],x, xmin,
xmax, 2000] − SimpsonRule [Min[ymin+(k-1)*h,p[x]] ,x, xmin,
xmax, 2000])/h, ymin+h*(2*k-1)/2},{k,1,m+1}]
T[[1]]={xmax,ymin};T[[m+1]]={xmin,ymax};
TR=Reverse[T]
ListPlot[TR,PlotJoined->True]
pr[x_]=Interpolation[TR] [x]
der=D[pr[x],x]
SimpsonRule[der^2/pr[x],x,xmin,xmax,2000]
Plot[pr[x],{x,xmin,xmax}]
Plot[der,{x,xmin,xmax},PlotRange->All]
Plot[(pr[x]-(1+.5*Cos[Pi*x])),{x,xmin,xmax},
PlotRange->All]
```

In the preferred embodiment, the algorithm of the present invention results in a computer program operable in response to an input of a probability density function to produce another probability density in interpolating function form, so as to perform data compression, said program comprising the steps of:

receiving said probability density function;

performing a centrifuge effect operation on said probability density function resulting in similar density values being pushed towards a wall at a predetermined x-value, organized from larger amplitudes to smaller amplitudes;

approximating a calculation of the Fisher information in said resulting probability density in interpolating function form, wherein said resulting probability density in interpolating function form preserves Shannon entropy of said original probability density function and the calculated Fisher information is a minimum for a resulting lateral movement of density.

Said program may further be adapted for performing vertical or centripetal movement of density, while preserving Shannon entropy.

Said program is stored in a computer readable medium, such as a floppy disk, a hard disk drive, CD-ROM, DVD-ROM, or RAM, and other well known computer readable mediums.

Applications for the Computer Program

The results of the algorithm of the present invention may provide helpful alternate information for problems such as image reconstruction, due to the fact that, for example in tomography, radiation may be collected on a wall behind a sample, whereby higher densities of sample contribute less radiation, so that higher "probability density" correlates with less radiation received on the collecting or detecting wall (Cf. Li 2004). There the problem is reverse to the invention discussed, namely the interest there is minimizing information loss, going from the collected density in the wall back to the original density of the sample.

Further applications may be in problems such as protein folding, wherein current algorithms attempt to minimize energy, apparently without reference to the thermodynamic constraint of constant entropy (Cf. Schultz 1999).

While the present invention has been shown and described herein in what are conceived to be the most practical and preferred embodiments, it is recognized that departures, modifications, adaptations, variations and alterations in the described algorithm may be made and will be apparent to those skilled in the art of the foregoing description which does not depart from the spirit and scope of the invention which is therefore not to be limited to the details herein.

What is claimed is:

1. A computer readable medium which stores a program operable in response to an input of a probability density function to produce another probability density in interpolating function form, so as to perform data compression, said program comprising the steps of:

receiving said probability density function;

performing a centrifuge effect operation on said probability density function operable to result in similar density values being pushed towards a wall at a predetermined x-value, organized from larger amplitudes to smaller amplitudes; and approximating a calculation of the Fisher information in said resulting probability density in interpolating function form, wherein said resulting probability density in interpolating function form preserves Shannon entropy of said original probability density function and the calculated Fisher information is a minimum for a resulting lateral movement of density values.

2. The program recited in claim 1, wherein in said step of receiving said probability density function, said probability density function is in histogram-type form.

3. The program of claim 1, wherein said predetermined x-value corresponds to x=0.

4. The program recited in claim 1, wherein said predetermined x-value is different from 0.

5. The program recited in claim 1, wherein the steps of said program, in addition to said probability density function, are also applied for other parameters of the group consisting of mean and variance.

6. The computer program recited in claim 1, further including, in addition to said step of performing a centrifuge effect operation on said probability density function operable to result in similar density values being pushed towards a wall at a predetermined x-value, organized from larger amplitudes to smaller amplitudes, a step of:

performing a "vertical centrifuge" effect operation on said probability density function operable to result in a redistribution of amplitudes, in particular said program which assigns to a continuous probability density a normal or Gaussian density with the same Shannon entropy of the original density, and further wherein said calculated Fisher information is maximally reduced for a resulting vertical movement of density values.

7. A computer readable medium which stores a program operable in response to an input of a probability density function to produce another probability density in interpolating function form, so as to perform data compression, said program comprising the steps of:

receiving said probability density function;

performing a "vertical centrifuge" effect operation on said probability density function operable to result in a redistribution of amplitudes, in particular said program which assigns to a continuous probability density a normal or Gaussian density with the same Shannon entropy of the original density; and approximating a calculation of the Fisher information in said resulting probability density in interpolating function form, wherein said resulting probability density in interpolating function form preserves Shannon entropy of said original probability density function and the calculated Fisher information is maximally reduced for a resulting vertical movement of density values.

8. A computer readable medium which stores a program operable in response to an input of a probability density function to produce another probability density in interpolating function form, so as to perform data compression, said program comprising the steps of:

receiving said probability density function;

performing a centripetal effect operation on said probability density function so as to collect probability symmetrically about a predetermined point, organized from larger amplitudes to smaller amplitudes; and approximating a calculation of the Fisher information in said resulting probability density in interpolating function form, wherein said resulting probability density in interpolating function form preserves Shannon entropy of said original probability density function and the calculated Fisher information is a minimum for a resulting at least one of radial or sectoral movement of density values.

9. The computer program recited in claim 8, further including, in addition to said step of performing a centripetal effect operation on said probability density function so as to collect probability symmetrically about a predetermined point, organized from larger amplitudes to smaller amplitudes, a step of:

performing a "vertical centrifuge" effect operation on said probability density function operable to result in a redistribution of amplitudes, in particular said program which assigns a normal or Gaussian density with the same Shannon entropy of the original density, and further wherein said calculated Fisher information is maximally reduced for a resulting at least one of radial or sectoral movement of density values.

* * * * *